United States Patent [19]

Lafferty

[11] 3,831,111

[45] Aug. 20, 1974

[54] TEMPERATURE COMPENSATOR FOR A CRYSTAL OSCILLATOR

[75] Inventor: Edwin Carlton Lafferty, Lynchburg, Va.

[73] Assignee: General Electric Company, Lynchburg, Va.

[22] Filed: Aug. 6, 1973

[21] Appl. No.: 386,060

[52] U.S. Cl. .............................. 331/116 R, 331/176

[51] Int. Cl. .............................................. H03b 5/36

[58] Field of Search ............................ 331/116, 176

[56] References Cited

UNITED STATES PATENTS

| | | | |
|---|---|---|---|
| 3,373,379 | 3/1968 | Black | 331/176 |
| 3,397,367 | 8/1968 | Steel et al. | 331/176 |
| 3,454,903 | 7/1969 | Page | 331/176 |
| 3,508,168 | 4/1970 | Chan | 331/176 |
| 3,531,739 | 9/1970 | Groves | 331/176 |

*Primary Examiner*—John Kominski

[57] ABSTRACT

Crystal oscillators have been provided with a negative temperature characteristic capacitor to improve the frequency stability of the oscillator in the middle range of temperature, and have been provided with a voltage sensitive capacitor to improve the frequency stability of the oscillator in the cold and hot ranges of temperature. A temperature compensator is provided for varying the voltage applied to the voltage sensitive capacitor as a function of temperature. The temperature compensator has a middle temperature range circuit, a cold temperature range circuit, and a hot temperature range circuit which can stabilize the oscillator frequency to within plus or minus two parts per million (−2 ppm) over a temperature range between −40° C and +85° C.

2 Claims, 2 Drawing Figures

TEMPERATURE COMPENSATOR FOR A CRYSTAL OSCILLATOR

BACKGROUND OF THE INVENTION

My invention relates to crystal oscillators having a voltage sensitive capacitor, and particularly to a temperature compensator for controlling the voltage applied to such a voltage sensitive capacitor, and hence for providing a stable oscillator frequency over a wide range of temperatures.

In radio communication equipment, piezoelectric crystals are used almost exclusively as frequency-determining elements. As the technology in this field has improved, the frequency stability of the piezoelectric crystals with respect to temperature has steadily increased. Thus, in oscillators using piezoelectric crystals, it is fairly common to have a frequency stability of plus or minus 5 parts per million (±5 ppm) over a termperature range between −30°C and +85°C. (As used herein, frequency stability stated in parts per million indicates the frequency variation that a crystal has with respect to its center frequency. Thus, if a crystal has a center frequency of 8 megahertz and a stability of ±2 ppm for a given temperature range, the crystal frequency should not vary more than 2/1,000,000 time 8,000,000, or ±16 hertz over that temperature range.) Recent applications in radio communication require even greater frequency stability over an even greater temperature range.

Accordingly, a primary and general object of my invention is to provide a new and improved temperature compensator for a crystal oscillator.

Another and fairly specific object of my invention is to provide a new temperature compensator that can maintain the frequency stability of a crystal oscillator to within ±2 ppm over a temperature range of −40°C to +85° C.

SUMMARY OF THE INVENTION

Briefly, these and other objects are achieved by a temperature compensator in accordance with my invention and used with a crystal controlled oscillator having a voltage sensitive capacitor, and usually having a negative temperature characteristic capacitor. My temperature compensator responds to various temperatures over a wide temperature range, and provides a voltage for the voltage sensitive capacitor so as to maintain a stable oscillator frequency over that temperature range. My temperature compensator comprises three circuits: a middle range temperature compensating circuit, a cold range temperature compensating circuit, and a hot range temperature compensating circuit. The middle range circuit uses fixed resistors. The cold range circuit uses an inverse temperature sensitive resistor to provide an increasing voltage as the temperature falls. The hot range circuit uses an inverse temperature sensitive resistor to provide a decresing voltage as the temperature rises. And finally, the cold and hot range circuits are interconnected so the cold circuit blocks the hot circuit when the temperature is below the middle range, and so that the hot circuit blocks the cold circuit when the temperature is above the middle range.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

DESCRIPTION OF THE PREFERRED EMBODIMENT

Figure 1:
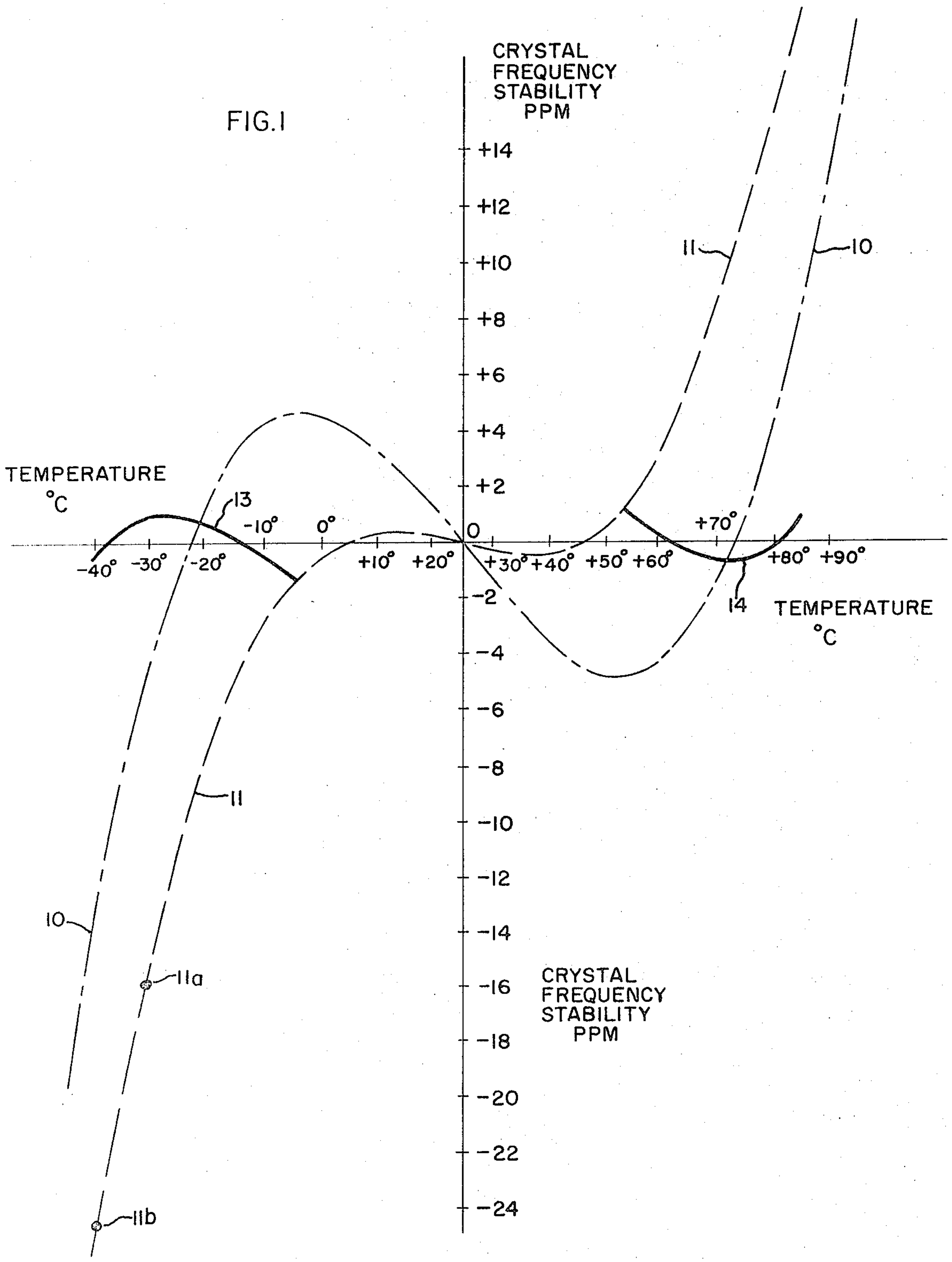
FIG. 1 shows curves which illustrate the frequency stability versus temperature characteristics of piezoelectric crystals, and the frequency stability which can be obtained by a temperature compensator in accordance with my invention.

Persons skilled in the crystal oscillator art are all too familiar with the variation in natural frequency which a piezoelectric crystal undergoes as the temperature of the crystal changes. The dash and dotted line curve 10 of FIG. 1 illustrates an example of such variations. In FIG. 1, the horizontal or X-axis represents temperature in degrees centigrade (°C), and the vertical or Y-axis represents the crystal stability in parts per million (ppm). As used in this specification, stability in ppm defines the variation in some unit (such as hertz) from the nominal center frequency of the crystal in the same unit. Thus, as mentioned earlier in this application, if a piezoelectric crystal has a nominal center frequency of 8 megahertz, (8,000,000 cycles), and if the crystal stability is ±2 ppm, then the frequency of the crystal may vary 16 hertz above or below the center frequency of 8,000,000 cycles. Again with respect to the curve 10 in FIG. 1, it will be seen that the particular crystal represented has a frequency stability of approximately −16 ppm at a temperature −4° C, and that this stability changes to 0 ppm at approximately −22° C. As the temperature continues to rise, the stability changes to a maximum of approximately +4 ppm at about −5° C, and then changes back to 0 ppm at approximately +26.5° C. (This point is referred to as the pivot point. For most crystals of the AT cut, this pivot point where the frequency stability is 0 ppm occurs at approximately +26.5°C.) As the temperature continues to rise, the stability changes again to about −5 ppm at +50° C. The stability continues to change, reaching 0 ppm at about +75° C, and then continues to change as shown. Thus, an examination of the curve 10 will show that for a wide range of temperature, as is common for much electronic equipment today, the frequency stability of the crystal varies through rather wide extremes. And where the crystal frequency stability determines the overall frequency stability of the electronic equipment, it will be seen that such electronic equipment may have a wide frequency variation.

One solution which has been provided by persons skilled in the art is to shift or rotate the crystal frequency stability characteristic about the pivot point. With respect to the curve 10 in FIG. 1, this means rotating the curve 10 in a counterclockwise direction so that the crystal stability is fairly flat or fixed on both sides of the 26.5° C point. This rotation has been achieved by the use of an inverse temperature sensitive capacitor connected into the oscillator circuit. The use of such a capacitor provides a frequency stability exemplified by the dashed line curve 11 in FIG. 1. With respect to this curve 11, it will be noted that the frequency stability of such a capacitor and crystal is greatly improved in the temperature range between approximately −5° C and +55° C. However, at temperatures below −5° C and at temperatures above +55° C, it will be seen that the frequency stability is less than that provided by a crystal having a characteristic illustrated by the curve 10. Accordingly, it is a principle object of my invention to improve the frequency stability of piezoelectric crystals at these relatively cold and hot extremes of temperature. And specifically, it is an object of my invention to provide a temperature compensator which holds the crystal frequency stability to within ±2 ppm between a temperature of −40°C and +85°C. As far as I am aware, this has not been achieved by persons skilled in the art prior to my invention, although good stabilities down to −30° C and up to +85° C have been achieved. In this regard, the frequency stability illustrated in curve 11 at −30° C is shown at the point 11*a*, and is approximately −16 ppm. At −40° C, the stability is shown at the point 11*b*, and is approximately −24 ppm. Thus, increasing the stability of a crystal to a useful range at −40° C from −30° C means compensating for over 8 ppm (the difference between −16 and −24). As rotation is varied and as the 26.5° C pivot point varies, the −40° C uncompensated stability may vary from about −22 ppm to −34 ppm. For this reason, increasing the stability in the cold temperature regions as much as 10° represents a large compensation in parts per million stability.

Figure 2:
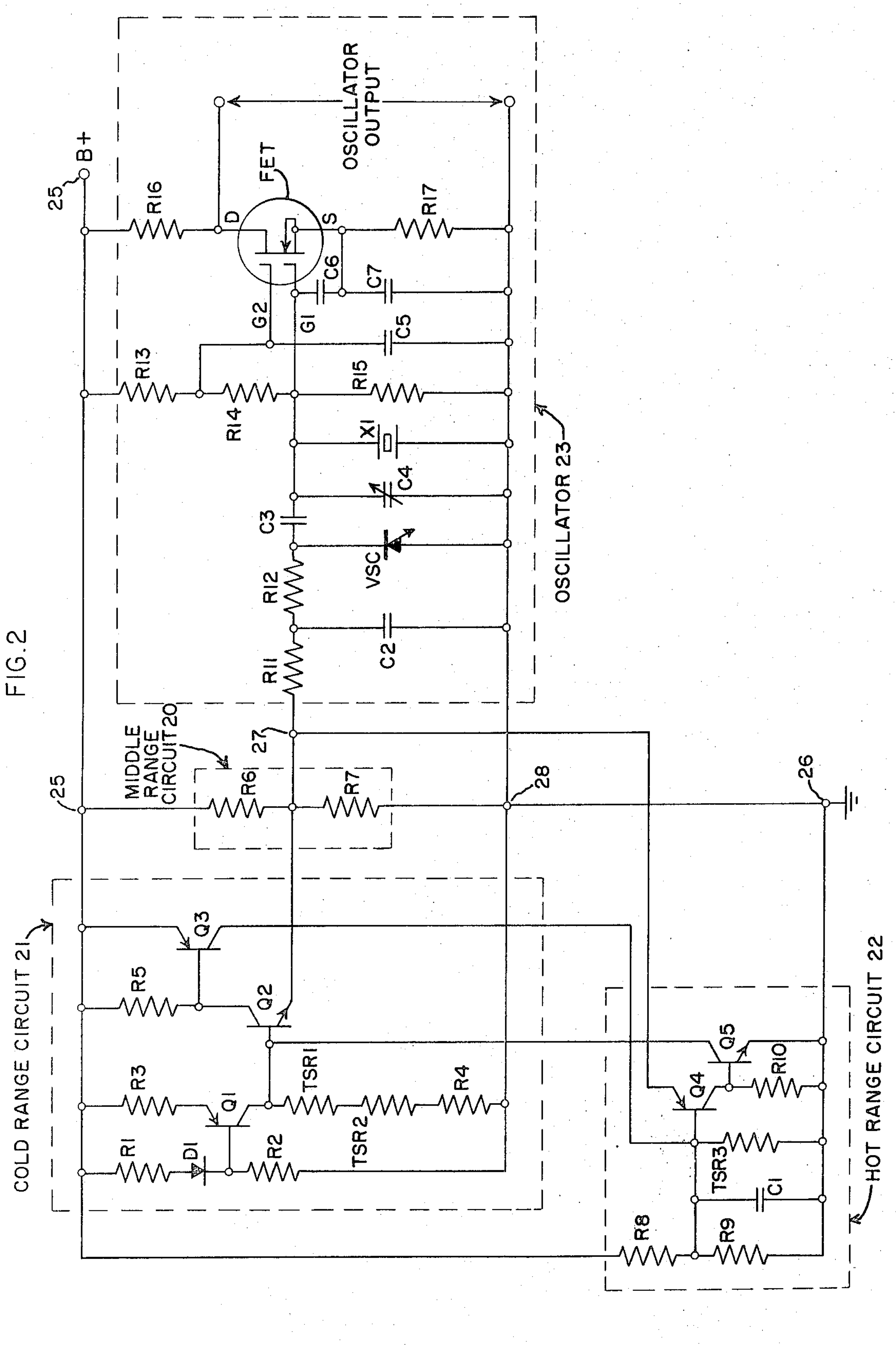
FIG. 2 shows a circuit diagram of a preferred embodiment of my temperature compensator as used with a crystal oscillator.

One embodiment of a temperature compensator in accordance with my invention which provides this stability is shown in the circuit diagram of FIG. 2. My temperature compensator comprises a middle range temperature compensating circuit 20, a cold range temperature compensating circuit 21, and a hot range temperature compensating circuit 22. These three circuits provide temperature compensation voltages to an oscillator 23 which may take a number of forms, so long as the oscillator is provided with an inverse voltage sensitive capacitor VSC which is illustrated electrically as a diode with an arrow. The middle range temperature compensating circuit 20 provides the compensating voltage between the temperature of approximately −10 or 0° C up to a temperature of approximately +55 or +60° C. The cold range circuit 21 provides the compensating voltage below this middle range down to −40° C, and the hot range circuit 22 provides the compensating voltage above this middle range up to +85° C. My temperature compensating circuit has source terminals 25, 26 which are connected to a suitable source of direct current potential. In FIG. 2, the terminal 25 would be connected to the positive terminal of the source, and the terminal 26 would be connected to the negative terminal of the source. The terminal 26 may also be grounded as shown. My temperature compensator is provided with two output terminals 27, 28. Generally, the output terminal 28 would be connected to the grounded source terminal 26 as shown.

The middle range temperature compensating circuit 20 comprises two substantially identical resistors R6, R7 connected in series between the source terminals 25, 26. The junction of the resistor R6, R7 is connected to the output terminal 27, and provides a fixed reference or middle range voltage for the oscillator 23 when the cold range compensating circuit 21 and the hot range compensating circuit 22 are not functioning. In the middle range of operation, the fixed voltage is supplied to the voltage sensitive capacitor VSC in the oscillator 23 so that the other internal portions of the oscillator 23 provide whatever frequency stability is required.

In the cold range temperature compensating circuit 21, a voltage divider is provided by a resistor R1, a diode rectifier D1, and a resistor R2 connected in series between the terminal 25 and the terminal 26. The upper end of the resistor R2 thus provides a fixed bias voltage which is applied to the base of a transistor Q1. The emitter of the transistor Q1 is connected through a resistor R3 to the terminal 25, and the collector of the transistor Q1 is connected through two inverse temperature sensitive resistors TSR1, TSR2 and an ordinary resistor R4 to the terminal 26. As known in the art, each of these temperature sensitive resistors TSR1, TSR2 has an inverse resistor-temperature characteristic. Thus, when the temperature increases, the resistance decreases, and when the temperature decreases, the resistance increases. The collector of the transistor Q1 is also connected to the base of an output transistor Q2. The collector of the transistor Q2 is connected through a resistor R5 to the terminal 25, and its emitter is connected to the output terminal 27. A blocking signal is derived at the collector of the transistor Q2 and applied to a blocking output transistor Q3. The emitter of the transistor Q3 is connected to the terminal 25, and the collector of the transistor Q3 is connected to the hot range temperature compensating circuit 22.

In the compensating circuit 22, a voltage divider is provided by two resistors R8, R9 connected between the terminal 25 and the terminal 26. The junction of these resistors R8, R9 is connected to the base of an output ransistor Q4. A bypass capacitor C1 is provided, and an inverse temperature sensitive resistor TSR3 is connected between the base of the transistor Q4 and the terminal 26. The emitter of the transistor Q4 is connected to the output terminal 27, and its collector is connected through a resistor R10 to the terminal 26. A blocking signal is derived from the collector of the transistor Q4 and connected to the base of a blocking output transistor Q5. The collector of the transistor Q5 is connected to the cold range temperature compensating circuit 21 at the base of the transistor Q2. The blocking signal from the cold range circuit 21 is connected to the base of the transistor Q4.

Again with respect to FIG. 1, the purpose of the cold range temperature compensating circuit 21 is to improve the stability characteristic of the curve 11 at temperatures between approximately −5° C and −40° C, and the purpose of the hot range temperature compensating circuit 22 is to improve the crystal stability at temperatures between approximately +55° C and +85° C. First, the operation of the cold range temperature compensating circuit 21 will be described. As the temperatures decrease, the resistance of the inverse temperature sensitive resistors TSR1, TSR2 increases in magnitude. With a fixed bias applied to the base of the transistor Q1 and a corresponding relatively fixed emitter-collector current in the transistor Q1, the voltage at the collector of the transistor Q1 increases. This causes an increase in current through the transistor Q2 so that the voltage at the output terminal 27 increases. This increased voltage is coupled through the resistors R11, R12 in the oscillator 23 to decrease the capacity of the voltage sensitive capacitor VSC. The decreased capacity provided in the oscillator 23 causes the freqeuncy to increase, so that the stability becomes less negative or more positive. The net result of the cold range temperature compensating circuit 21 is to provide a stability illustrated by the solid line curve 13 in FIG. 1 which intersects the curve 11 at approximately −5°C and at a stability of −2 ppm. In addition, the increased current through the transistor Q2 lowers the base voltage on the transistor Q3 and turns this transistor Q3 on. This provides a blocking signal at the collector of the transistor Q3 which is at a relatively positive voltage. This signal is applied to the base of the transistor Q4 in the circuit 22 to cut off this transistor Q4 so that the hot range temperature compensating circuit 22 can not function when the cold range circuit 21 is functioning.

At the hot range of temperature, that is between +55° C and +85° C, the hot range temperature compensating circuit 22 functions. As the temperature increases, the resistance of the inverse temperature sensitive resistor TSR3 decreases so that the transistor Q4 conducts more heavily. This lowers the voltage at the terminal 27 and this, in turn, causes an increase of capacity presented by the voltage sensitive capacitor VSC. The net effect of this increased capacity is to lower the apparent frequency of the oscillator 23 and provide the stability illustrated by the solid line curve 14 in FIG. 1. It will be seen that this solid line curve 14 intersects the curve 11 at approximately +55° C and at a stability of +1.5 ppm. In addition, the increased current through the transistor Q4 raises the base voltage on the transistor Q5 and turns this transistor Q5 on. This provides a blocking signal at the collector of the transistor Q5 which is at a relatively negative voltage. This signal is applied to the base of the transistor Q2 in the circuit 21 to cut off this transistor Q2 so that the cold range temperature compensating circuit 21 can not function when the hot range circuit 22 is functioning.

The net effect of my temperature compensator is shown by the solid line curve 13, the dashed line curve 11 between the temperatures of approximately −5° C and +55° C, and the solid line curve 14. It will be seen that the stability is within plus or minus 2 ppm over the temperature range of −40° C to +85° C, and persons skilled in the art will appreciate this significant advance in the art, particularly at the cold end.

Persons skilled in the art will also appreciate that my temperature compensator can be used with a number of oscillator arrangements, as long as the oscillator is provided with a frequency determining voltage sensitive capacitor such as the capacitor VSC. The oscillator 23 shown in FIG. 2 is a Colpitts circuit which uses a dual gate field effect transistor FET connected as shown. A piezoelectric crystal is connected between the gate G1 and the terminal 26. A trimmer capacitor C4 may be connected in parallel with the crystal X1. The gate G1 is connected to a normal capacitor C6 and an inverse temperature capacitor C7. This capacitor C7 provides the stability rotation which, if needed, can change the oscillator stability characteristic from that shown in curve 10 to that shown in curve 11. The oscillator output can be derived between the drain electrode D and the terminal 26. Again, it is to be emphasized that my temperature compensator can be used with various types of oscillator circuits.

An embodiment of my temperature compensator was constructed in accordance with the diagram of FIG. 2 to provide the characteristics shown by the curves 13, 14 and the part of the curve 11 between these curves 13, 14. This circuit had the following values:

| Circuit Element | Value |
|---|---|
| Source voltage | 10 volts |
| Resistor R1 | 3,000 ohms |
| Resistor R2 | 27,000 ohms |
| Resistor R3 | 2,000 ohms |
| Resistor R4 | 10,000 ohms |
| Resistor R5 | 56,000 ohms |
| Resistors R6, R7 | 24,000 ohms each |
| Resistor R8 | 15,000 ohms |
| Resistor R9 | 16,700 ohms |
| Resistor R10 | 56,000 ohms |
| Temperature Sensitive Resistor TSR1 | Negative temperature coefficient thermistor $R_o$ = 2.2K, B = 1750 |
| Temperature Sensitive Resistor TSR2 | Negative temperature coefficient thermistor $R_o$ = 100K, B = 3530 |
| Temperature Sensitive Resistor TSR3 | Negative temperature coefficient thermistor $R_o$ = 200K, B = 4500 |
| Capacitor C1 | 2,200 micromicrofarads |
| Diode D1 | Silicon |
| Transistor Q1 | Silicon, PNP |
| Transistor Q2 | Silicon, NPN |
| Transistor Q3 | Silicon, PNP |
| Transistor Q4 | Silicon, PNP |
| Transistor Q5 | Silicon, NPN |
| Voltage Sensitive Capacitor VSC | Silicon Hyperabrupt C = 8 pf at 4V Bias |

It will thus be seen that my temperature compensator provides a new and improved arrangement for improving the frequency stability of piezoelectric crystal oscillators over a wider temperature range. While I have shown only one embodiment, persons skilled in the art will appreciate that modifications may be made. In particular, with respect to my cold range temperature compensating circuit 21, only one temperature sensitive resistor may be used, depending upon the degree of stability required. However, I prefer two such temperature sensitive resistors because they provide a more flexible design arrangement. Therefore, it is to be understood that modifications may be made without departing from the spirit of the invention or from the scope of the claims.

What I claim as new and desire to secure by U.S. Letters Patent is:

1. An improved temperature compensator for use with a crystal oscillator operating in a cold range, a middle range, and a hot range of temperature, said oscillator having at least one middle range negative temperature characteristic capacitor, and having at least one voltage sensitive capacitor, said improved temperature compensator comprising:

a. first and second source terminals adapted to be connected to a source of direct current;

b. first and second output terminals adapted to be connected to the voltage sensitive capacitor in an oscillator;

c. means connecting said second source terminal to said second output terminal;

d. a middle range temperature compensating circuit comprising:

1. first and second substantially equal resistors connected in series between said first and second source terminals;
2. means connecting the junction of said first and second resistors to said first output terminal;

e. a cold range termperature compensating circuit comprising:
   1. a first transistor having an emitter, a base, and a collector;
   2. a first resistor having an inverse resistor-temperature characteristic;
   3. means connecting the emitter-collector path of said first transistor and said first resistor in series between said first and second source terminals;
   4. means connected from said first and second source terminals to said base of said first transistor for applying a selected bias voltage thereto;
   5. a second transistor having an emitter, a base, and a collector;
   6. a second resistor;
   7. means connecting said second resistor and the emitter-collector path of said second transistor in series between said first source terminal and said first output terminal;
   8. means connecting said base of said second transistor to the junction of said emitter-collector path of said first transistor and said first resistor;
   9. means connected to the junction of said second resistor and said emitter-collector path of said second transistor for deriving a first blocking signal from said cold range termperature compensating circuit;

f. a hot range temperature compensating circuit comprising:

1 a third resistor having inverse resistor-temperature characteristics;
   2. means connecting said third resistor in series between said first and second source terminals;
   3. a fourth transistor having an emitter, a base, and a collector;
   4. a fourth resistor;
   5. means connecting the emitter-collector path of said fourth transistor and said fourth resistor in series between said first output terminal and said second source terminal;
   6. means connecting said base of said fourth transistor to said third resistor;
   7. means connected to the junction of said fourth transistor and said fourth resistor for deriving a second blocking signal from said hot range temperature compensating circuit;

g. means for connecting said cold range temperature deriving means to said base of said fourth transistor for applying said first blocking signal thereto;

h. and means for connecting said hot range temperature deriving means to said base of said second transistor for applying said second blocking signal thereto.

2. The improved temperature compensator of claim 1 and further comprising a fifth resistor having an inverse resistor-temperature characteristic, and means connecting said fifth resistor in series with said emitter-collector path of said first transistor and said first resistor.

* * * * *

UNITED STATES PATENT OFFICE

CERTIFICATE OF CORRECTION

Patent No. 3,831,111 Dated August 20, 1974

Inventor(s) Edwin Carlton Lafferty

It is certified that error appears in the above-identified patent and that said Letters Patent are hereby corrected as shown below:

| | |
|---|---|
| Line 14 of Abstract | cancel "(-2 ppm)" and insert -- (±2 ppm) -- |
| Col. 1, line 26 | cancel "time" and insert -- times -- |
| line 59 | cancel "decresing" and insert -- decreasing -- |
| Col. 2, line 37 | cancel "-4°C" and insert -- -40°C -- |

Signed and sealed this 11th day of March 1975.

(SEAL)
Attest:

RUTH C. MASON
Attesting Officer

C. MARSHALL DANN
Commissioner of Patents
and Trademarks